United States Patent
Kim et al.

(10) Patent No.: US 8,392,804 B2
(45) Date of Patent: Mar. 5, 2013

(54) RECEIVER POWER SAVING VIA BLOCK CODE FAILURE DETECTION

(75) Inventors: Hun-Seok Kim, Addison, TX (US); Seok-Jun Lee, Allen, TX (US); Anuj Batra, Dallas, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 308 days.

(21) Appl. No.: 12/846,065

(22) Filed: Jul. 29, 2010

(65) Prior Publication Data

US 2011/0055643 A1 Mar. 3, 2011

Related U.S. Application Data

(60) Provisional application No. 61/238,798, filed on Sep. 1, 2009.

(51) Int. Cl.
*G06F 11/00* (2006.01)
(52) U.S. Cl. .................. 714/776; 714/767
(58) Field of Classification Search .......... 714/776, 714/775, 777, 767, 766, 758, 765
See application file for complete search history.

(56) References Cited

U.S. PATENT DOCUMENTS

| | | | |
|---|---|---|---|
| 2006/0245384 A1* | 11/2006 | Talukdar et al. | 370/310 |
| 2007/0183540 A1 | 8/2007 | Agazzi et al. | |
| 2008/0253337 A1* | 10/2008 | Kim | 370/336 |
| 2008/0301477 A1* | 12/2008 | Gade et al. | 713/320 |
| 2009/0204777 A1* | 8/2009 | Norman | 711/163 |
| 2009/0204877 A1* | 8/2009 | Betts | 714/806 |

OTHER PUBLICATIONS

D. Davenport, et al., "MedWiN Physical Layer Proposal," IEEE P802.15-09-0329-00-0006, Wireless Personal Area Networks, May 2009 (38 page total).

\* cited by examiner

*Primary Examiner* — Dieu-Minh Le
(74) *Attorney, Agent, or Firm* — Steven A. Shaw; W. James Brady; Frederick J. Telecky, Jr.

(57) ABSTRACT

A communication system includes a receiver configured to receive a packet that contains plural codewords, and a codeword failure detector cooperatively operable with the receiver. The codeword failure detector can be configured to detect a codeword failure in at least one codeword of the plural codewords as it is being received by the receiver, and to terminate reception at the receiver, when the codeword failure is detected before the end of the packet, to put the receiver into a power save mode for a duration of a remainder of the packet that contains the at least one codeword.

20 Claims, 6 Drawing Sheets

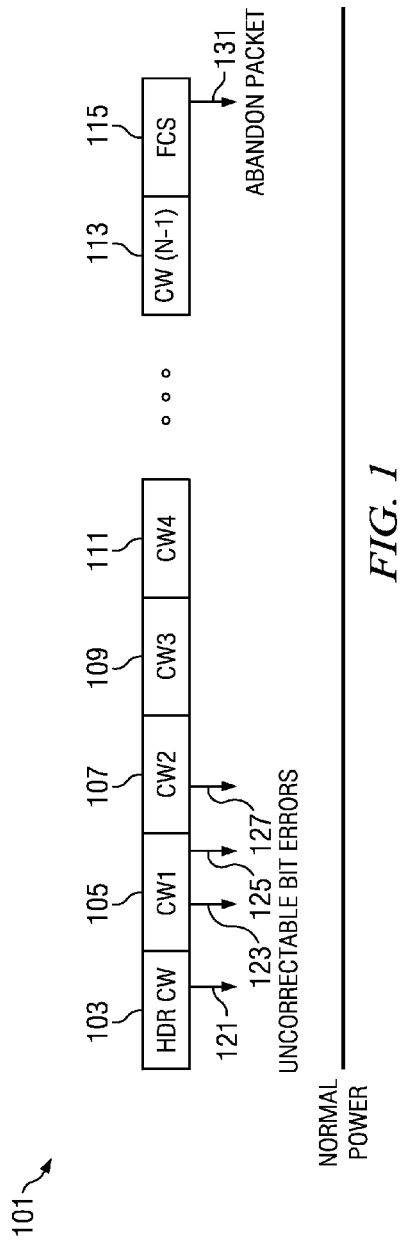
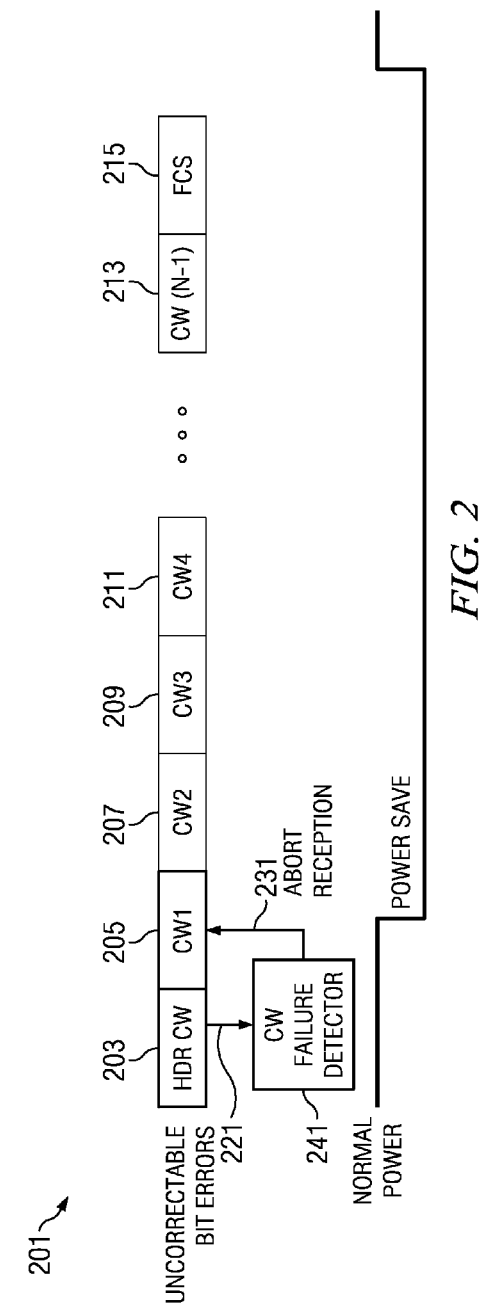
FIG. 1 (PRIOR ART)
FIG. 2

RECEIVER POWER SAVING VIA BLOCK CODE FAILURE DETECTION

CROSS-REFERENCE TO RELATED APPLICATIONS

This application claims the benefit of the following Provisional application: 61/238,798 filed Sep. 9, 2009, which is expressly incorporated herein by reference.

TECHNICAL FIELD

The technical field relates in general to packet communication systems, and more specifically to detection of codeword failure in packets.

BACKGROUND

A typical packet based communication system discards a packet if it contains bit errors. In order to find the errors in the packet, in general, receiver needs to execute the frame validity check procedure based on the FCS (frame check sequence) which is available at the end of the packet. In that case, the receiver is not able to tell whether or not the packet is error-free until the entire packet is received and processed. Therefore, in high packet error rate environments, the receiver ends up wasting power to process entire packets although a majority of them are going to be discarded.

Meanwhile, typical communication systems employ the HCS (header check sequence) to identify an invalid packet header because the packet header contains demodulation parameters which are essential to decode a received packet correctly. However, for some communication systems such as IEEE P802.15.6 (personal area network physical layer standard (such as IEEE P802.15-09-0329-00-0006, Wireless Personal Area Networks, MedWiN Physical Layer Proposal)), the HCS is not very reliable to catch all header errors. For example, the HCS in IEEE P802.15.6 employs only a two-bit HCS, which implies that at least 25% of invalid packet headers are regarded as valid headers if they pass the HCS by coincidence. The misdetection of an invalid packet header (that is, when an invalid packet header passes the HCS check) causes significant processing power waste at the receiver because errors in the packet header result in incorrect packet decoding.

What is needed is a method for codeword failure detection technique enabling early termination of packet processing at receivers where packet errors (a packet is made up of many codewords) or header errors are detected before the end of the packet without checking FCS or HCS. System level power saving can be achieved by discarding the received packet immediately when the proposed codeword failure detector asserts a codeword failure.

SUMMARY

Accordingly, one or more embodiments provide a method for receiving packets, a communication system for receiving packets, or a wireless body area network modem. The embodiment can provide for a receiver configured to receive a packet that contains plural codewords; and a codeword failure detector cooperatively operable with the receiver. The codeword failure detector can be configured to detect a codeword failure in at least one codeword of the plural codewords as it is being received by the receiver, and to terminate reception at the receiver, when the codeword failure is detected before the end of the packet, to put the receiver into a power save mode for a duration of a remainder of the packet that contains the at least one codeword.

The codeword failure can be detected without checking frame check sequence (FCS) alone or header check sequence (HCS) alone in the packet for a packet header error.

The embodiment can further include monitoring packet error rate (PER) statistics for packets received by the receiver, and disabling the codeword failure detector when the PER falls below a threshold to reduce power consumption in a low PER environment.

The embodiment can further include a packet header validity check based on the codeword failure detector.

The embodiment can be embodied in a medical wireless body area network modem.

In an embodiment, the codeword failure detector can be configured to examine each codeword output from a forward error correction (FEC) decoder, check if the decoded codeword is a valid codeword, and to signal the codeword failure in response to the decoded codeword output from the FEC decoder not being a valid codeword.

In an embodiment, the codeword failure detector can be configured to examine each codeword output from an FEC decoder, to perform codeword parity bit reconstruction on the received codeword, and to signal the codeword failure in response to the codeword parity bit reconstruction failing.

In an embodiment, the codeword failure detector can be configured to examine each codeword output from an FEC decoder, to perform syndrome reconstruction on the received codeword, and to signal the codeword failure in response to the syndrome reconstruction failing.

In an embodiment, the codeword failure detector can be configured to examine each codeword output from an FEC decoder, to perform a zero syndrome check on the received codeword, and to signal the codeword failure in response to the zero syndrome check failing.

In an embodiment, the codeword failure can be configured to check a number of error bits in the received codeword compared to a maximum number of correctable bits, and to signal the codeword failure in response to the number of error bits exceeding the maximum number of correctable bits.

According to another embodiment, a wireless body area network modem includes a receiver apparatus configured to receive a packet that contains plural codewords; and a codeword failure detector cooperatively operable with the receiver apparatus. The codeword failure detector is configured to detect a codeword failure in at least one codeword of the plural codewords as it is being received by the receiver, and terminate reception at the receiver of a remainder of the packet that contains the at least one codeword before the end of the packet, when the codeword failure is detected, the codeword failure being detected without checking frame check sequence (FCS) alone or header check sequence (HCS) alone in the packet for a packet header error.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

The accompanying figures, where like reference numerals refer to identical or functionally similar elements and which together with the detailed description below are incorporated in and form part of the specification, serve to further illustrate various exemplary embodiments and to explain various principles and advantages in accordance with the embodiments.

FIG. 1 illustrates packet processing and timing in a prior art system without codeword failure detection;

FIG. 2 illustrates packet processing and timing in a system with codeword failure detection;

DETAILED DESCRIPTION

Figure 3:
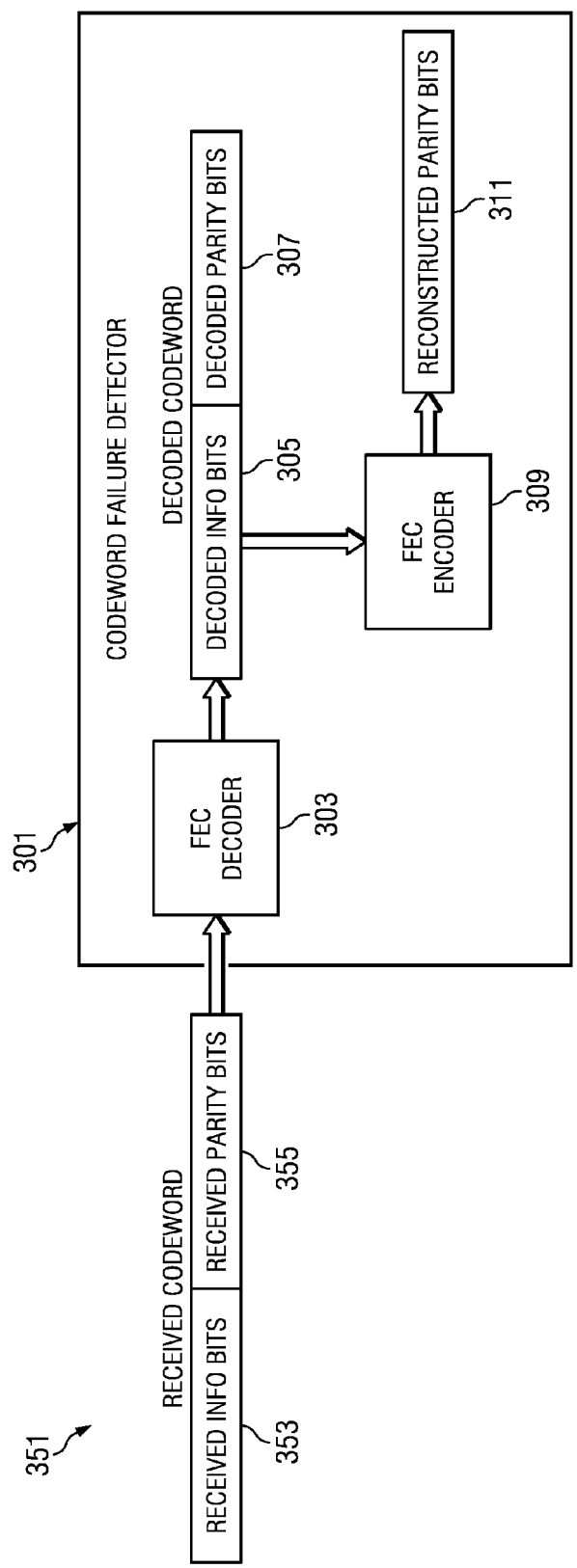
FIG. 3 illustrates a codeword reconstruction in accordance with an embodiment.

In overview, the present disclosure concerns packet communication networks for supporting devices or units, often referred to as communication systems or communication units, which can be equipped for wireless communications. Some of these packet communication networks are short range wireless networks some of which are referred to as a wireless body area network (WBAN) or a body area network (BAN), and can include mobile, wearable and/or implantable devices that can wirelessly transmit data such as from a body being monitored over a short range, from whence the data can be forwarded, for example used in a medical body monitoring application. Such communication systems may process communication packets which comprise one or more codewords. More particularly, various inventive concepts and principles are embodied in communication systems, devices, and methods therein for processing codewords and packets in a wireless packet communication network.

The instant disclosure is provided to further explain in an enabling fashion the best modes of performing one or more embodiments. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in integrated circuits (ICs) and/or software, such as a digital signal processor and software therefore, and/or application specific ICs. It is expected that one of ordinary skill, notwithstanding possibly significant effort and many design choices motivated by, for example, available time, current technology, and economic considerations, when guided by the concepts and principles disclosed herein will be readily capable of generating such ICs or software instructions with minimal experimentation. Therefore, in the interest of brevity and minimization of any risk of obscuring principles and concepts, further discussion of such ICs and software, if any, will be limited to the essentials with respect to the principles and concepts used by the exemplary embodiments.

As further discussed herein below, various inventive principles and combinations thereof are advantageously employed to provide a method for codeword failure detection technique enabling early termination of packet processing at receivers where packet errors (a packet is made up of many codewords) or header errors are detected before the end of the packet without checking FCS or HCS. System level power savings can be achieved by discarding the received packet immediately when the proposed codeword failure detector asserts a codeword failure.

Further in accordance with exemplary embodiments, a communication system with a block code as forward error correction (FEC) scheme can identify the packet failure without processing the entire packet. A codeword failure detector can be employed to examine each output codeword of the FEC decoder and check if a decoded codeword is a valid codeword or not. In the case that the codeword failure detector finds an invalid codeword output from the FEC decoder, it can declare a packet error before the receiver completes processing the entire packet. The error bits uncorrectable by the FEC decoder shall eventually cause the packet error and in this case, the packet will be dropped at a receiver. Therefore, receiver processing can be immediately stopped as soon as a codeword failure is declared in order to avoid unnecessary power consumption to process the entire packet which is going to be discarded in the end.

In addition, the codeword failure detector can be used to catch an invalid packet header. For some communication systems such as IEEE P802.15.6 (personal area network physical layer standard), the HCS is short and may not catch all header errors. Instead of solely relying on the HCS, one can employ the codeword failure detector to catch invalid packet headers. The received packet can be discarded to minimize wasted processing power if codeword failure is detected in the packet header.

Accordingly, there can be provided a system-level power saving method which employs a codeword failure detector to discard a packet with errors before the end of the packet. The method can be used to detect invalid headers when the HCS is not very reliable. Further, in the method, the codeword failure detector can be disabled in low PER environments to minimize the power consumption overhead.

Referring now to FIG. 1 and FIG. 2, packet processing and timing in a prior art system without codeword failure detection will be compared to packet processing and timing in a system with codeword failure detection.

FIG. 1 illustrates packet processing and timing in a prior art system without codeword failure detection. A single packet 101 includes plural codewords, and has a standard header codeword 103. The packet 101 including the header codeword (CW) 103, subsequent codewords CW1 105, CW2 107, CW3 109, CW4 111, CW(N−1) 113, and an FCS 115 includes uncorrectable bit errors 121, 123, 125, 127 in the first three codewords. Power remains at normal power levels for the receiver. The packet 101 is discarded at the end of the packet by the FCS check, which is checked and results in determining to abandon the packet 131.

Referring now to FIG. 2, packet processing and timing in a system with codeword failure detection will be discussed and described. A single packet 201, which is the same as in FIG. 1, includes plural codewords, and has a standard header codeword 203. The packet 201 including the header codeword 203, subsequent codewords CW1 205, CW2 207, CW3 209, CW4 211, CW(N−1) 213, and an FCS 215 includes at least one uncorrectable bit error 241. In this example, the uncorrectable bit error is in the header codeword 203, but it could occur in any other place in any of the codewords. When the codeword begins to be received, power is at normal power level for the receiver. However, the codewords are input 221 to a codeword failure detector 241 as they are received; and the codeword failure detector 241 aborts 231 reception of the packet 201 when a failure is detected (that is, an uncorrectable bit error). The packet 201 is discarded as soon as the uncorrectable bit error 241 is detected by the codeword failure detector, which signals 231 the receiver to abort reception of the remainder of the packet, and the remainder of the packet is not received because reception is aborted. Accordingly, the receiving process terminates early for an error packet as soon as a codeword failure is detected.

Further, when reception is aborted, the receiver is placed in power save mode for the duration of the remainder of the packet 201. When the duration expires, power is raised to normal power so as to receive the next packet. The remainder of the duration of the packet can be determined according to known techniques, for example based on length of the packet which may be stated in a header or may be fixed according to the communication protocol. Also, receiving a next packet is a known technique.

In high packet error environments, one can expect significant power saving by employing the codeword failure detector since the probability that a codeword failure is declared before the end of a packet is high. On the contrary, in low packet error environment, codeword failure is not be declared for the majority of codewords. Hence, in that case, one can disable the codeword failure detector in order to minimize the power consumption overhead. The enabling/disabling mechanism of the codeword failure detector can be implemented based on the SNR (signal to noise ratio) or received signal strength information or packet error rate.

When the codeword failure has not been declared before the last codeword of the packet, the codeword failure detector can be disabled for the last codeword to reduce the power consumption overhead. In that case, the packet error can be declared after processing the entire packet, as in a conventional system, that is based on the FCS check.

Figure 4:
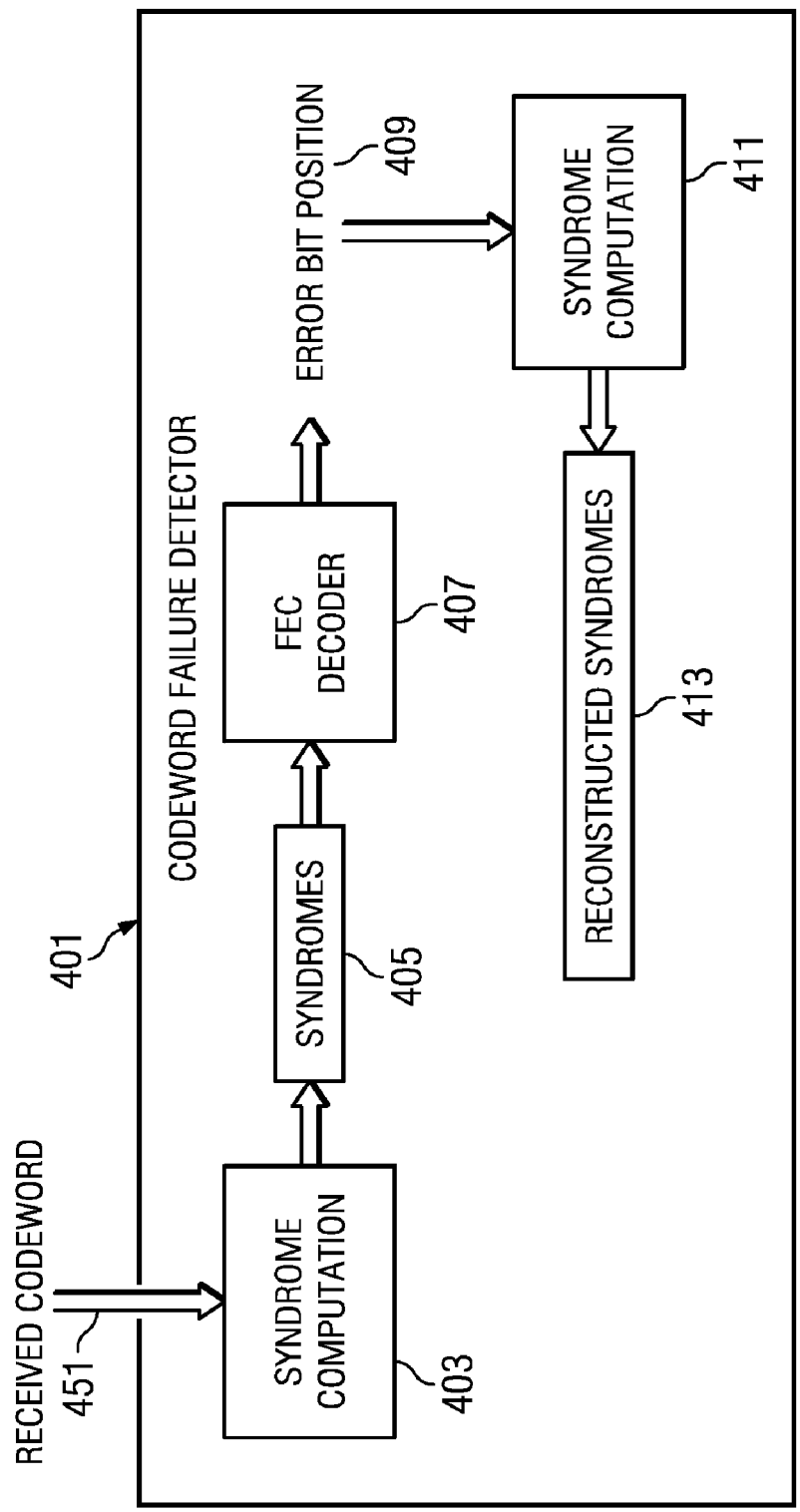
FIG. 4 illustrates a syndrome reconstruction in accordance with an embodiment.
Figure 5:
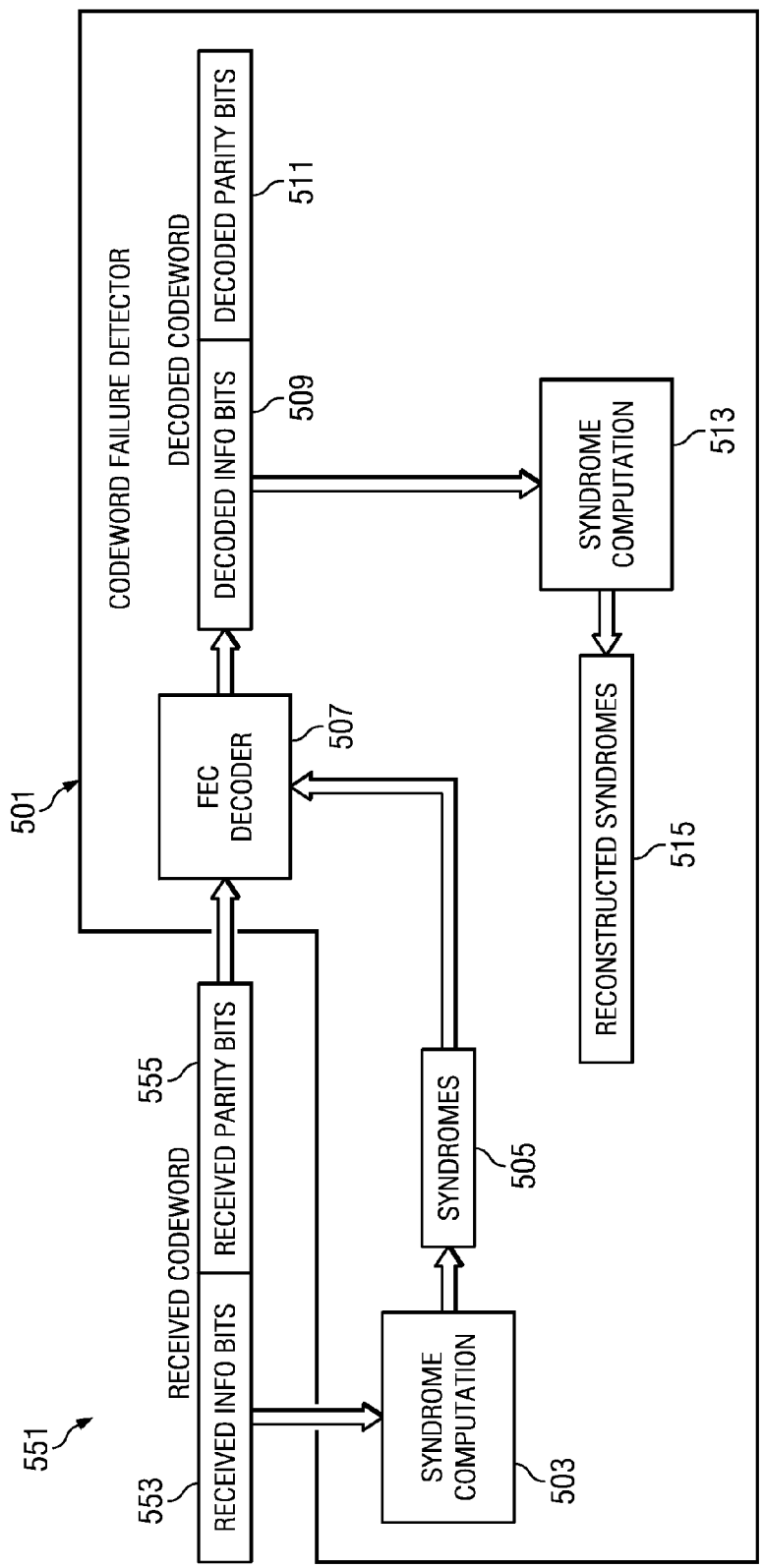
FIG. 5 illustrates a zero syndrome check in accordance with an embodiment.

Different ways to detect a codeword failure: There are different ways to implement a codeword failure detector. The following discussion and FIG. 3, FIG. 4, and FIG. 5 illustrate by way of example four methods to detect and declare codeword failures.

Method 1—Codeword Reconstruction

Referring now to FIG. 3, a codeword reconstruction in accordance with an embodiment will be discussed and described. FIG. 3 (Method 1) includes a typical FEC decoder 303 and FEC encoder 309. A codeword 351 is being received (information bits field 353 plus parity bits field 355 comprise one codeword 351) at a codeword failure detector 301 and input to the FEC Decoder 303. Output is decoded info bits 305 and decoded parity bits 307. The decoded info bits 305 are input to the FEC encoder 309, which outputs reconstructed parity bits 311 which are compared to the decoded parity bits 307.

In the case of the systematic block code, a codeword 351 consists of the information bits 353 and parity bits 355. In order to find an invalid codeword, the parity bits are reconstructed based on the information bits decoded from the FEC decoder 303 as depicted in FIG. 3. The reconstructed parity bits 311 are compared to the decoded parity bits 307 from the FEC decoder 303. A codeword failure is declared if the reconstructed and decoded parity bits 307, 311 are not identical.

In summary, in Method 1, received codewords are input to the codeword failure detector 301. In the codeword failure detector 301, the FEC decoder 303 generates decoded codewords which comprises decoded information bits 305 and decoded parity bits 307. From the decoded information bits 305, the received signal is re-encoded by the FEC encoder 309, and then the parity bits 311 from the reconstructed codeword are compared to the decoded parity bits 307. If they are the same, the error (if any) was corrected. If they are not the same, some error has not been corrected and there is a codeword failure. A codeword can be decoded and reconstructed via an FEC decoder and an FEC encoder with any of various known or conventional techniques.

Method 2—Syndrome Reconstruction

Referring now to FIG. 4, a syndrome reconstruction in accordance with an embodiment will be discussed and described. A received codeword 451 is received at a codeword failure detector 401, is input into a syndrome computation 403 and outputs the original syndrome 405, which is passed into an FEC decoder 407, which outputs error bit positions 409. A syndrome is recomputed 411 from the output of the decoder 407 (error bit positions 409) to provide a reconstructed syndrome 413. The reconstructed syndrome 413 is compared to the original syndrome 405 (error bit position 411 is input). The output of the reconstructed syndrome 413 should be the same as the input syndrome 405 if the codeword 451 is valid.

Another way to implement an FEC block code decoder is to use syndromes to find the error bits. The syndromes 405 are computed based on the received codeword 451 and the FEC decoder 407 determines the positions of error bits 409 based on the syndromes 405. In that case, the codeword failure can be declared when appropriate by observing the error bit positions 409 determined by the FEC decoder. To continue, new syndromes 413 are reconstructed based on the error bit positions 409 and the reconstructed syndromes 413 are compared to the original syndromes 405 as depicted in FIG. 4. When the reconstructed syndrome 413 and the original syndrome 405 are not identical, a codeword failure is declared. Note that when the received codeword 451 does not contain any errors, all syndromes are zero. In the case that the syndromes 405 are zero, the codeword failure detector 401 can declare that there is no codeword failure without reconstructing the syndromes.

A syndrome computation 403 can be a special purpose circuit, and/or a computation circuit can be adapted to perform a syndrome computation, according to known techniques.

Note that the output of FEC decoder 407 does not by itself necessarily indicate whether there is a codeword failure. In the codeword reconstruction method, the codeword is input to the FEC decoder, and the decoded information bits are input to an FEC encoder so that reconstructed parity bits are compared to decoded parity bits. In comparison, in the syndrome reconstruction method, the syndrome is computed and input to the FEC decoder and then a syndrome is reconstructed from the FEC decoder output.

If the syndrome 405 is a zero syndrome, this indicates that there is no error in the codeword 451; a non-zero syndrome means there is some error in the codeword 451. The FEC decoder 407 produces output based on the input syndrome 405. So, if the syndrome is reconstructed from the output of the FEC decoder 407, it should be zero when the received codeword 451 has no error. This method uses the original syndrome 405 input to the FEC decoder 407 and the reconstructed syndrome 413 reconstructed from the output of the FEC decoder 407. By comparing these two it can be judged whether the codeword 451 is valid or not. If the original syndrome 405 and the reconstructed syndrome 413 are the same, there is no error in the codeword 451. Note that this method uses the error bit positions 409 output from the FEC decoder 407.

Method 3—Zero Syndrome Check

Referring now to FIG. 5, a zero syndrome check in accordance with an embodiment will be discussed and described. The beginning of FIG. 5 is similar to the beginning of FIG. 4 in that a received codeword 551 comprising received information bits 553 and received parity bits 555 is input to a syndrome computation 503 in a codeword failure detector 501, which outputs syndromes 505, which are input to an FEC decoder 507, which then outputs a decoded codeword comprising decoded information bits 509 and decoded parity bits 511. However, in FIG. 5, the received codeword 551 is also input to the FEC decoder 507, and the input to the syndrome computation 513 is the decoded codeword. The reconstructed syndrome 515 is output from the syndrome computation 513, and will be zero when the codeword 551 is valid.

That is, instead of reconstructing syndromes based on error bit locations as in FIG. 4, one can re-compute syndromes based on the decoded codeword as depicted in FIG. 5. In that case, the reconstructed syndromes 515 are all zero when the decoded codeword is error-free. Otherwise, when the reconstructed syndromes 515 are not zero a codeword failure is declared.

Zero syndrome computation is a generally known technique, but has not been employed as here to check for codeword failure.

Method 4—Number of Error Bits Checking Method

Other methods can be used to determine, codeword-by-codeword while the codewords are being received, whether or not one of the codewords in the packet has an uncorrectable error. In a method checking the number of error bits (not illustrated), an FEC decoder uses the information about the number of correctable bits and the number of error bits in a codeword. Each codeword has a certain number of correctable bits. If the number of error bits is greater than the number of correctable bits, then there is a codeword failure.

In general, information about the number of correctable error bits is available from the FEC decoder. One of the simplest methods to check the codeword failure is to observe the number of error bits reported by the FEC decoder. The codeword failure detector can declare a codeword failure if the number of error bits reported by FEC decoder is larger than the maximum number of correctable bits. However, this method may not able to detect codeword failure if the FEC decoder is unable to identify the actual number of error bits due to the excessive number of error bits.

Other ways of detecting a codeword failure can be used instead of the four methods discussed above.

Figure 6:
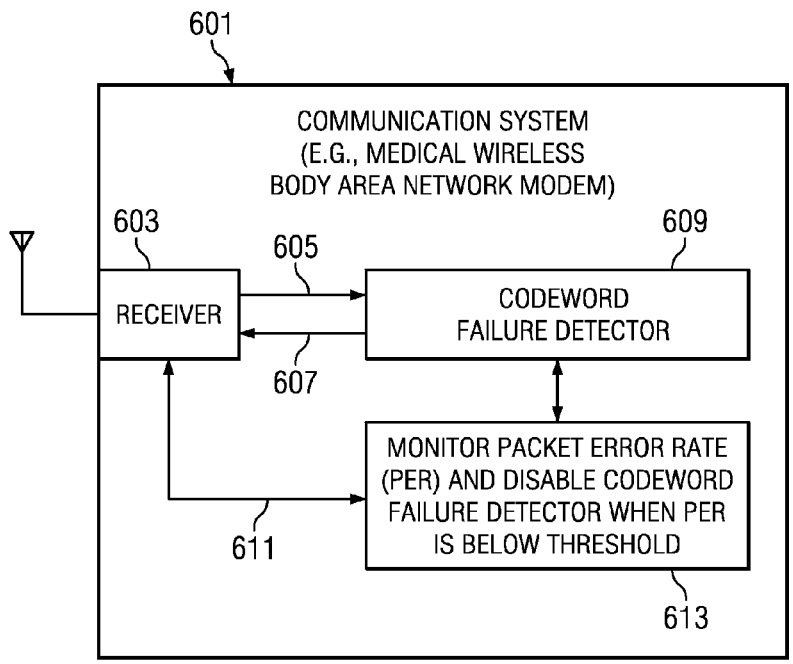
FIG. 6 is a block diagram illustration portions of a communication system for receiving packets.

Referring now to FIG. 6, a block diagram illustration portions of a communication system 601 for receiving packets will be discussed and described. A communication system 601 can include a receiver 603, a codeword failure detector 609, and a PER monitor and disable codeword failure detector 613.

A packet error rate (PER) can be monitored by checking the FCS according to generally used techniques. That is, in the communication system 601, the FCS can be checked, and FCS errors can be counted to provide the packet error rate. The PER measurement is usually performed in a receiver, but can be at least partly implemented in a higher processing layer.

The receiver 603 may be implemented as a transceiver incorporating receiver functionality.

Before considering the communication systems of FIG. 6, consider that a conventional communications system uses only forward error correction. In the case of a packet with multiple code words, the conventional way to find whether there is a received packet error is to check the FCS at the end of the packet, which means that the conventional communications system has to receive and process the entire packet in order to determine whether there was a received packet error.

In the case of FIG. 6, a codeword (which is one of multiple codewords in a packet) is received by a receiver 603. Each codeword 605 can be checked by the codeword failure detector 609, and if the codeword 605 contains an uncorrectable error, there is no need to decode the entire packet. The codeword failure detector 609 can assert that this packet has some error and signal 607 the receiver to discard the entire packet without decoding the entire packet.

As is known in the art, a packet incorporates one or more codewords. The header in the packet has information about the modulation scheme and the length of the packet (standard fields). The FCS is at the end of the full packet.

That is, codeword failure is detected in the codeword failure detector 609 while receiving the codeword 605, and once the codeword failure is detected, the codeword failure detector 609 can assert a signal 607 indicating codeword failure and the communication system 601 can stop receiving the packet at the receiver 603.

The codeword failure detector 609 can be implemented in hardware, alone and/or in combination with a software implementation. If the data rate of the system 601 is high, hardware can be advantageous to support the throughput, but in a low data rate system a software implementation can be appropriate.

The communication system 601 can include a signal 607 which is asserted upon the codeword failure occurring, which results in the receiver 603 aborting receipt of the packet. Receipt of the packet can be aborted in any known technique, for example, by disabling the receiver, dropping power to the receiver, by powering off the receiver, by flushing the packet, and/or similar techniques or variations thereof.

An example of the communication system 601 is a body area network or a medical wireless body area network modem, typically where the header also has a validity check sequence but which is not very strong because it is very short, or typically where the FEC is not very strong. Typically, in the body area network, the signal to noise ratio is not high, so errors are frequent.

In a medical wireless body area network, the observed operating packet error rate is high, about 20%. So about 20% of packets are being discarded, but conventionally the entire packet is being decoded to detect the error. In a body area network, the application can be, for example, to measure a patient's blood pressure once per hour. Accordingly, a low PER is not required since the packet is not delay critical and it can just be retransmitted in the event of errors. The transmit power conventionally is set to be not very high, so the body area network may operate at a high PER. That is, the application may frequently receive packets containing errors. A body area network is a low power network and the actual distance in operation generally is two or three meters. For example, in an EKG test, a sensor is attached to the patient's body with a wireless modem in it and the data is collected wirelessly from the sensor, with the communication system 601 being for example embedded on a chip in the sensor of the body area network. This is just an example for discussion purposes; many other applications are possible.

The communication system 601 may include the receiver 603, the codeword failure detector 609, the monitor PER and disable codeword failure detector 613, and/or other features and functions which are not illustrated but will be well understood to those of skill in this area such as a microprocessor or digital signal processors which may control the operation of the communication system 601.

If the communication system 601 is used in an environment generates fewer packet errors, the power savings by operating the codeword failure detector which reduces power upon occurrence of codeword errors are not achieved and may be offset by power consumption used to operate the codeword failure detector 609. Thus, the communication system 601 can monitor 613 the packet error rate (PER) statistics 611, and can disable the codeword failure detector 609 when the PER is low which will reduce power consumption.

Expected Power Saving

In order to quantify the power saving from the proposed method, consider a scenario where a packet contains $N_{CW}$ codewords. The packet error rate (PER) and the codeword failure rate, $E_{CW}$, have the relationship of equation (1). Based on equation (1), one can compute the codeword failure rate, $E_{CW}$, as a function of PER as summarized in Table 1 for a particular scenario $N_{CW}=10$.

$$PER = 1 - (1-E)^{N_{CW}} \quad (1)$$

Table 1 illustrates a relation between PER and codeword failure rate.

TABLE 1

PER and $E_{CW}$ for the scenario $N_{CW} = 10$:

| | PER | | |
|---|---|---|---|
| | 0.25 | 0.5 | 0.7 |
| $E_{CW}$ | 0.0284 | 0.0670 | 0.1134 |

We denote $P_{CW}$ as the power consumption to process a single codeword. The total power consumption $P_{T0}$ to process entire packet without codeword failure detection can be computed as in equation (2). Meanwhile, the average number of error-free codewords, $N_{E\_FREE}$, before the first codeword error in the packet is obtained by equation (3). The power consumption of a system with the proposed codeword failure detector, $P_{T1}$, can be modeled by equation (4) assuming the power consumption overhead of codeword failure detection is negligible.

$$P_{T0} = P_{CW} \cdot N_{CW} \quad (2)$$

$$N_{E\_FREE} = N_{CW} \cdot (1-E_{CW})^{N_{CW}} + \sum_{k=1}^{N_{CW}} k \cdot (1-E_{CW})^{k-1} \cdot E_{CW} \quad (3)$$

$$P_{T1} = P_{CW} \cdot N_{E\_FREE} \quad (4)$$

Figure 7:
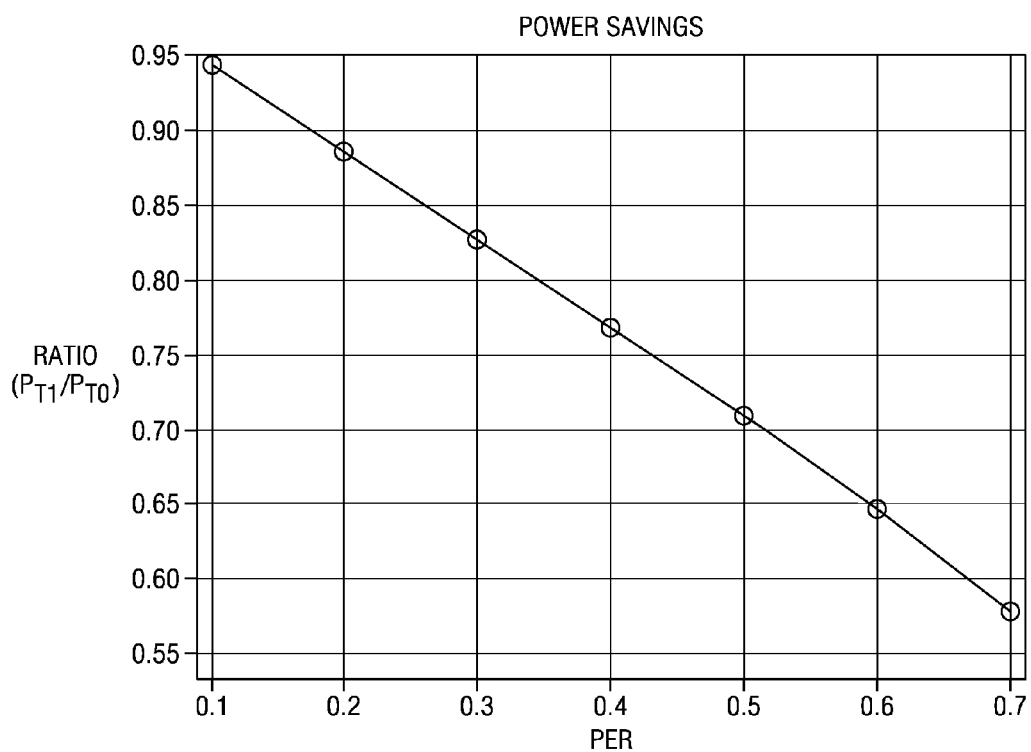
FIG. 7 illustrates expected power savings in accordance with an embodiment.

Referring now to FIG. 7, expected power savings in accordance with an embodiment will be discussed and described. FIG. 7 illustrates the ratio of $P_{T0}/P_{T0}$ under various PER scenarios when $N_{CW}=10$. It is shown from FIG. 7 that 5~35% power saving can be achieved in the PER range of 10%~70% by employing the codeword failure detection discussed herein.

In FIG. 7, $P_{T1}$ indicates power consumption when the codeword failure detector is used and $P_{T0}$ indicates power consumption when the codeword failure detector is not used. These numbers in FIG. 7 are theoretical, to quantify the anticipated power savings. The X axis shows the packet error rate (PER). As shown in FIG. 7, at the PER of 50% (0.5), and the Ratio ($P_{T1}/P_{T0}$) is ~0.7, indicating that power consumption is 70% of a conventional system. That is, the communication system with the codeword failure detector is saving 30% of power. When the PER is 0.1, the Ratio ($P_{T1}/P_{T0}$) is ~0.95; so if the PER is 10%, power savings are 5%. When PER is 0.7, the Ratio ($P_{T1}/P_{T0}$) is ~0.58, so if PER is 70%, savings are 42%.

A typical packet based system does not terminate the receiving process until the entire packet is received and processed for the FCS check. The typical system processes a packet of the indicated length (whatever arrives at the input). At the end of the packet, the typical system checks the FCS and can tell if the packet is not correct.

By way of contrast, in the present communication system with codeword failure detector, the reception of a packet with errors can be terminated before the end of the packet. In the present system, upon the error and asserting the packet error and turning the receiver off, the receiver can wake up for the next packet or can restart to look for the next preamble sequence.

Furthermore, by monitoring the packet error rate (PER) statistics, the system may disable the codeword failure detector in low PER environments in order to minimize the power consumption overhead.

Codeword processing is performed at the physical layer in a layered model of computer networking. An indication of the codeword failure can be returned from the physical layer to an upper layer, and the upper layer can perform error handling per conventions if desired.

In addition, we propose packet header validity check method based on the codeword failure detector. This method can be particularly useful when the HCS is not very reliable (e.g. IEEE P802.15.6) to catch invalid packet headers.

Figure 8:
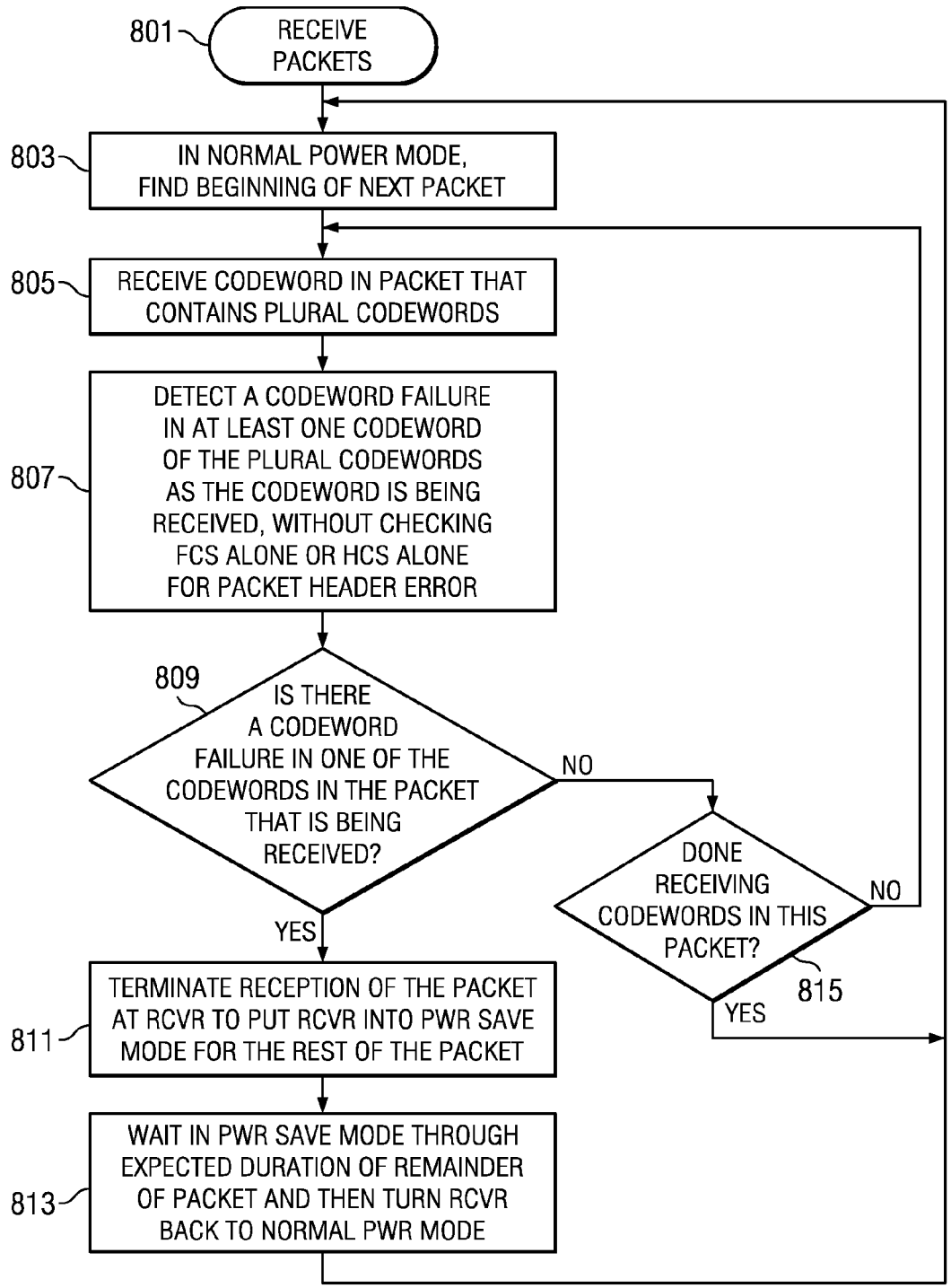
FIG. 8 is a flow chart illustrating a procedure to receive packets.

Referring now to FIG. 8, a flow chart illustrating a procedure to receive packets will be discussed and described. The procedure can advantageously be implemented in, for example, a communications system described in connection with FIG. 6 or other apparatus appropriately arranged.

The procedure for receiving packets 801 can find 803 a beginning of the next packet, in normal power mode. This can be a routine or conventional process performed according to known techniques. Once the beginning of the packet is noted, the packet is received codeword-by-codeword, as is known. The packet is generally received in normal power mode, although it is possible that a lower or higher power mode can be provided which is sufficient for a packet to be received. Specifically, then the procedure 801 can receive 805 a codeword in the packet that contains plural codewords.

The procedure 801 can then judge whether it can detect 807 a codeword failure in at least one codeword of the plural codewords as the codeword is being received, without checking the FCS alone or the HCS alone for a packet header error.

When there is not 809 a codeword failure detected in one of the codewords that is in the packet as the packet is being received, the process 801 continues on to check 813 whether it is done receiving codewords in this packet. If the process 801 is not done receiving codewords in this packet, it repeats to receive the next codeword 805 in the packet that contains plural codewords.

However, when there is 809 a codeword failure detected in one of the codewords that is in the packet as the packet is being received, the process 801 will terminate 811 reception of the packet at the receiver, to put the receiver into power save mode for the rest of the packet. Then, the process 801 will wait in power save mode through the expected duration of the remainder of the packet. The expected end of the packet is known from the usual length or size information in the packet header. After the expiry of the expected duration of the packet, the procedure 801 can turn the receiver back to normal power mode so that the next packet (following the packet with the codeword error) can be received.

It should be noted that the term "communication system" may be used interchangeably herein with communication device or communication unit. Each of these terms denotes a device which is typically a wireless mobile device that may be used with a packet communication network, typically using ultra low power and hence short range communications, some of which can also be equipped with motion detectors and/or physiological sensors. Examples of such units include wearable computing devices, wireless patient remote sensors, body sensor network nodes, wireless body area network modem, personal digital assistants, personal assignment pads, and personal computers equipped for wireless operation, a cellular handset or device, or equivalents thereof provided such units are arranged and constructed for operation with a packet communication network.

The designation "medical wireless body area network modem" is expressly defined herein to refer to an apparatus that includes wireless communication and a processor, and is configured to be used in accordance with a wireless personal area network, one example of the wireless personal area network being the IEEE P802.15.6 standard, variants and evolutions thereof.

Furthermore, the communication networks of interest include those that transmit information in packets, for example, those known as packet switching networks that transmit data in the form of packets, where messages can be divided into packets before transmission and the packets comprise codewords, the packets are transmitted, and the packets are routed over network infrastructure devices to a destination where the packets are recompiled into the message. Such networks include, by way of example, the Internet, intranets, local area networks (LAN), wireless LANs (WLAN), wide area networks (WAN), wireless body area networks (WBAN), body area networks (BAN), body sensor networks (BSN) and others. Protocols supporting communication networks that utilize packets include one or more of various networking protocols, such as IEEE P802.15.6 (personal area network physical layer standard (such as IEEE P802.15-09-0329-00-0006, Wireless Personal Area Networks, also referred to as MedWiN Physical Layer Proposal)), TCP/IP (Transmission Control Protocol/Internet Protocol), Ethernet, X.25, Frame Relay, ATM (Asynchronous Transfer Mode), IEEE 802.11, UDP/UP (Universal Datagram Protocol/Universal Protocol), IPX/SPX (Inter-Packet Exchange/Sequential Packet Exchange), Net BIOS (Network Basic Input Output System), GPRS (general packet radio service), I-mode and other wireless application protocols, and/or other protocol structures, and variants and evolutions thereof. Such networks can provide wireless communications capability and/or utilize wireline connections such as cable and/or a connector, or similar.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A communication system for receiving packets, comprising:
   receiver configured to receive a packet that contains plural codewords; and
   a codeword failure detector cooperatively operable with the receiver, and configured to
   detect a codeword failure in at least one codeword of the plural codewords as it is being received by the receiver, and
   terminate reception at the receiver, when the codeword failure is detected before the end of the packet, to put the receiver into a power save mode for a duration of a remainder of the packet that contains the at least one codeword.

2. The system of claim 1, the codeword failure being detected without checking frame check sequence (FCS) alone or header check sequence (HCS) alone in the packet for a packet header error.

3. The system of claim 1, further comprising monitoring packet error rate (PER) statistics for packets received by the receiver, and disabling the codeword failure detector when the PER falls below a threshold to reduce power consumption in a low PER environment.

4. The system of claim 1, further comprising a packet header validity check based on the codeword failure detector.

5. The system of claim 1, being embodied in a medical wireless body area network modem.

6. The system of claim 1, the codeword failure detector configured to examine each codeword output from an FEC decoder, checking if the decoded codeword is a valid codeword, and to signal the codeword failure in response to the decoded codeword output from the FEC decoder not being a valid codeword.

7. The system of claim 1, the codeword failure detector being configured to examine each codeword output from an FEC decoder, to perform codeword parity bit reconstruction on the received codeword, and to signal the codeword failure in response to the codeword parity bit reconstruction failing.

8. The system of claim 1, the codeword failure detector being configured to examine each codeword output from an FEC decoder, to perform syndrome reconstruction on the received codeword, and to signal the codeword failure in response to the syndrome reconstruction failing.

9. The system of claim 1, the codeword failure detector being configured to examine each codeword output from an FEC decoder, to perform a zero syndrome check on the received codeword, and to signal the codeword failure in response to the zero syndrome check failing.

10. The system of claim 1, the codeword failure being configured to check a number of error bits in the received codeword compared to a maximum number of correctable bits, and to signal the codeword failure in response to the number of error bits exceeding the maximum number of correctable bits.

11. A method for receiving packets, comprising:
receiving, in a receiver apparatus, a packet that contains plural codewords;
detecting, in a codeword failure detector cooperatively operable with the receiver apparatus, a codeword failure in at least one codeword of the plural codewords as it is being received by the receiver apparatus; and
terminating reception at the receiver, when the codeword failure is detected before the end of the packet, to put the receiver into a power save mode for a duration of a remainder of the packet that contains the at least one codeword
the codeword failure being detected without checking frame check sequence (FCS) alone or header check sequence (HCS) alone in the packet for a packet header error.

12. The method of claim 11, further comprising monitoring packet error rate (PER) statistics for packets received by the receiver apparatus, and disabling the codeword failure detector when the PER falls below a threshold to reduce power consumption in a low PER environment.

13. The method of claim 11, further comprising a packet header validity check based on the codeword failure detector.

14. The method of claim 11, being embodied in a medical wireless body area network modem.

15. The method of claim 11, the codeword failure detector configured to examine each codeword output from an FEC decoder, checking if the decoded codeword is a valid codeword, and to signal the codeword failure in response to the decoded codeword output from the FEC decoder not being a valid codeword.

16. The method of claim 11, the codeword failure detector being configured to examine each codeword output from an FEC decoder, to perform codeword parity bit reconstruction on the received codeword, and to signal the codeword failure in response to the codeword parity bit reconstruction failing.

17. The method of claim 11, the codeword failure detector being configured to examine each codeword output from an FEC decoder, to perform syndrome reconstruction on the received codeword, and to signal the codeword failure in response to the syndrome reconstruction failing.

18. The method of claim 11, the codeword failure detector being configured to examine each codeword output from an FEC decoder, to perform a zero syndrome check on the received codeword, and to signal the codeword failure in response to the zero syndrome check failing.

19. The method of claim 11, the codeword failure being configured to check a number of error bits in the received codeword compared to a maximum number of correctable bits, and to signal the codeword failure in response to the number of error bits exceeding the maximum number of correctable bits.

20. A wireless body area network modem, comprising:
a receiver apparatus configured to receive a packet that contains plural codewords; and
a codeword failure detector cooperatively operable with the receiver apparatus and configured to
detect a codeword failure in at least one codeword of the plural codewords as it is being received by the receiver, and
terminate reception at the receiver of a remainder of the packet that contains the at least one codeword before the end of the packet, when the codeword failure is detected, the codeword failure being detected without checking frame check sequence (FCS) alone or header check sequence (HCS) alone in the packet for a packet header error.

* * * * *